(12) United States Patent
Chen et al.

(10) Patent No.: US 7,999,910 B2
(45) Date of Patent: Aug. 16, 2011

(54) SYSTEM AND METHOD FOR MANUFACTURING A MASK FOR SEMICONDUCTOR PROCESSING

(75) Inventors: Chia-Jen Chen, Hsinchu (TW); Hsin-Chang Lee, Hsinchu (TW); Sheng-Chi Chin, Hsin-Chu (TW); Hung Chang Hsieh, HsinChu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1987 days.

(21) Appl. No.: 11/115,433

(22) Filed: Apr. 27, 2005

(65) Prior Publication Data

US 2006/0246357 A1 Nov. 2, 2006

(51) Int. Cl.
*G03B 27/32* (2006.01)
*G03B 27/58* (2006.01)
*G03D 5/00* (2006.01)

(52) U.S. Cl. .............................. 355/27; 355/72; 396/611
(58) Field of Classification Search .................. 396/611; 700/121; 355/27, 72
See application file for complete search history.

(56) References Cited

U.S. PATENT DOCUMENTS

| | | | |
|---|---|---|---|
| 6,165,678 A | 12/2000 | Allen et al. | |
| 6,277,546 B1 | 8/2001 | Breyta et al. | |
| 6,297,871 B1 | 10/2001 | Hagiwara | |
| 6,377,334 B2 | 4/2002 | Whiting | |
| 6,420,098 B1 | 7/2002 | Mautz | |
| 6,437,851 B2 | 8/2002 | Hagiwara | |
| 6,641,963 B1 | 11/2003 | Rangarajan et al. | |
| 7,042,553 B2 * | 5/2006 | An et al. | 355/72 |
| 7,145,643 B2 * | 12/2006 | Auer-Jongepier et al. | 355/72 |
| 7,268,853 B2 * | 9/2007 | Ryu et al. | 355/27 |
| 2004/0001188 A1 * | 1/2004 | Janssen et al. | 355/30 |
| 2004/0078108 A1 * | 4/2004 | Choo et al. | 700/121 |
| 2004/0107020 A1 * | 6/2004 | Yokoyama et al. | 700/121 |
| 2005/0061441 A1 | 3/2005 | Hashinoki et al. | |

OTHER PUBLICATIONS

Nagahara, Seiji, et al., "Radiation Chemistry of Triphenylsulfonium Salts in EB and X-Ray Chemically Amplified Resists—Proton Generation Mechanisms", Journal of Photopolymer Science and Technology, vol. 11, No. 4, 1998, pp. 577-580.

Hinsberg, W.D., et al., "Chemical and Physical Aspects of the Post-Exposure Baking Process Used for Positive-Tone Chemically Amplified Resist", IBM J. Res. & Dev., vol. 45, No. 5, Sep. 2001, pp. 667-682.

Parker, Jeffrey M., et al, "Direct Temperature Metrology Helps Minimize CA-Resist CD Variation", Solid State Technology, Sep. 2000, 4 pages.

Rathsack, Benjamen M., et al., "Lithography Simulation of Sub-0.30 Micron Resist Features for Photomask Fabrication Using I-Line Optical Pattern Generators", BACUS Symposium on Photomask Technology, SPIE vol. 3873, Sep. 1999, pp. 484-492.

* cited by examiner

*Primary Examiner* — Mark F Huff
*Assistant Examiner* — Stewart A Fraser
(74) *Attorney, Agent, or Firm* — Haynes and Boone, LLP

(57) ABSTRACT

The present disclosure provides a system and method for manufacturing a mask for semiconductor processing. In one example, the system includes at least one exposure unit configured to select a recipe for a later baking process in a post treatment unit, a buffer unit coupled to the exposure unit and configured to move the mask substrate from the exposure unit to the post treatment unit without exposing the mask substrate to the environment; and the post treatment unit coupled to the buffer unit and the exposure unit and configured to perform a baking process on the mask substrate using baking parameters associated with the recipe selected by the exposure unit.

16 Claims, 5 Drawing Sheets

SYSTEM AND METHOD FOR MANUFACTURING A MASK FOR SEMICONDUCTOR PROCESSING

BACKGROUND

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing devices having geometry sizes (e.g., the smallest component (or line) that may be created using the process) of 90 nm and below.

Many IC fabrication processes use a mask to transfer a particular pattern (e.g., a portion of a circuit) to a wafer in order to produce a semiconductor device, with each mask being unique to the particular pattern. The making of such masks has become increasingly complex as the geometry size of the devices produced using the masks is reduced. Current mask-making techniques are not sufficient to efficiently and cost-effectively produce high-quality masks needed for modern IC device fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3b illustrates various layers that may be used for manufacturing the mask of FIG. 3a.

DETAILED DESCRIPTION

Figure 1:
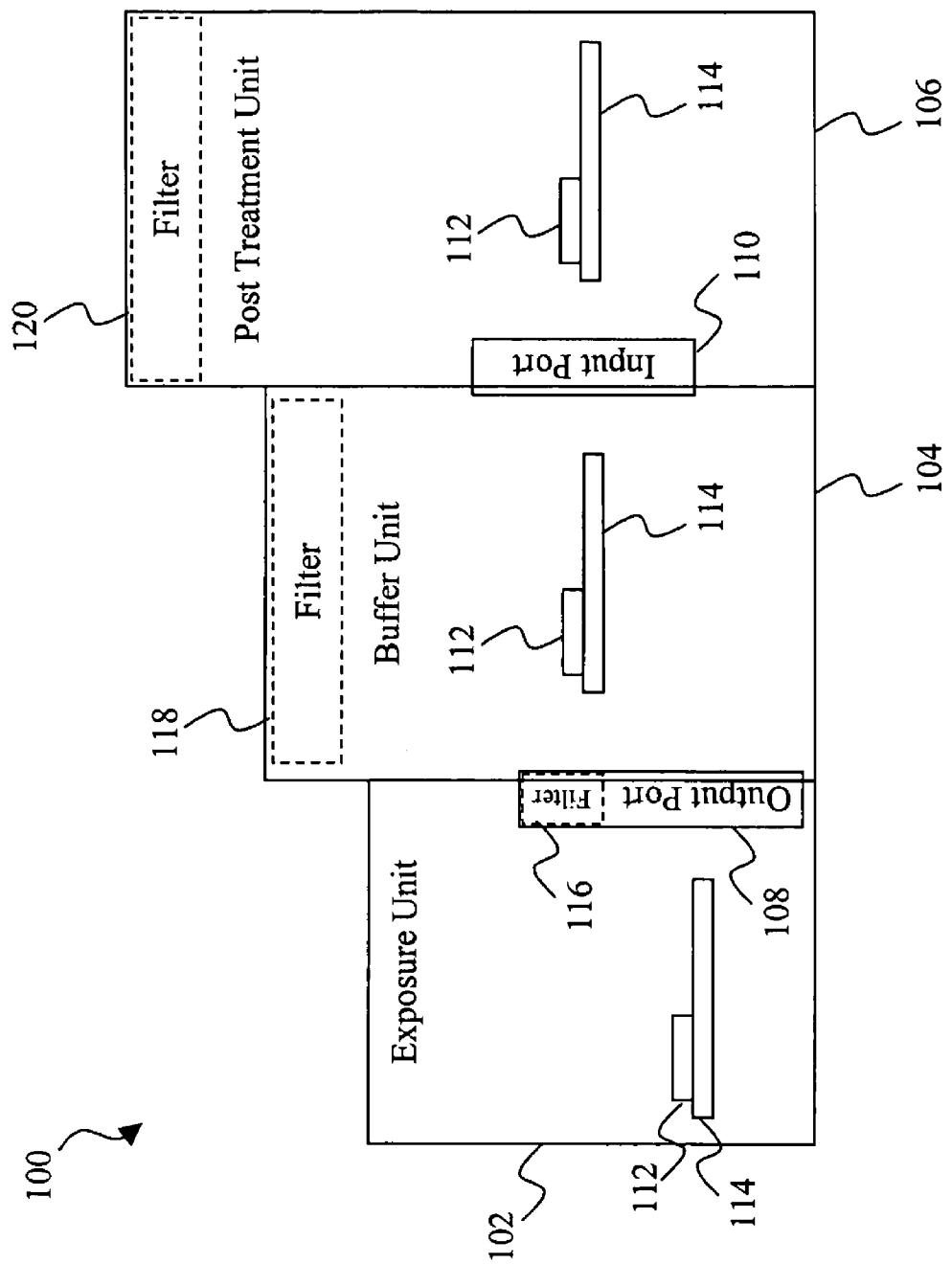
FIG. 1 is a schematic view of one embodiment of a system for implementing the present disclosure.

It is to be understood that the following disclosure provides many different embodiments, or examples, for implementing different features of the present invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, one embodiment of a system for manufacturing a mask is illustrated. The system includes an exposure unit 102, a buffer unit 104, and a post treatment unit 106. An output port 108 couples the exposure unit 102 and buffer unit 104, and an input port 110 couples the buffer unit 104 and post treatment unit 106. It is understood that the output port 108 and input port 110 may include parts of one or both of the units to which they are coupled, or may be separate from the units. Furthermore, it is understood that all or portions of the exposure unit 102, buffer unit 104, and post treatment unit 106 may be combined. For example, the buffer unit 104 may be integrated with the exposure unit 102 to form a single, standalone unit.

Although not shown, the exposure unit 102 includes exposing means for exposing a layer of resist 112 on a substrate 114. The exposing means may be either charged (e.g., a high-voltage electron beam device or an ion beam device) or non-charged (e.g., a laser beam or other light source). One example of such an exposure unit is an electron beam lithography system such as the EBM 4000, produced by NuFlare Technology, Inc., of Japan.

Figure 2:
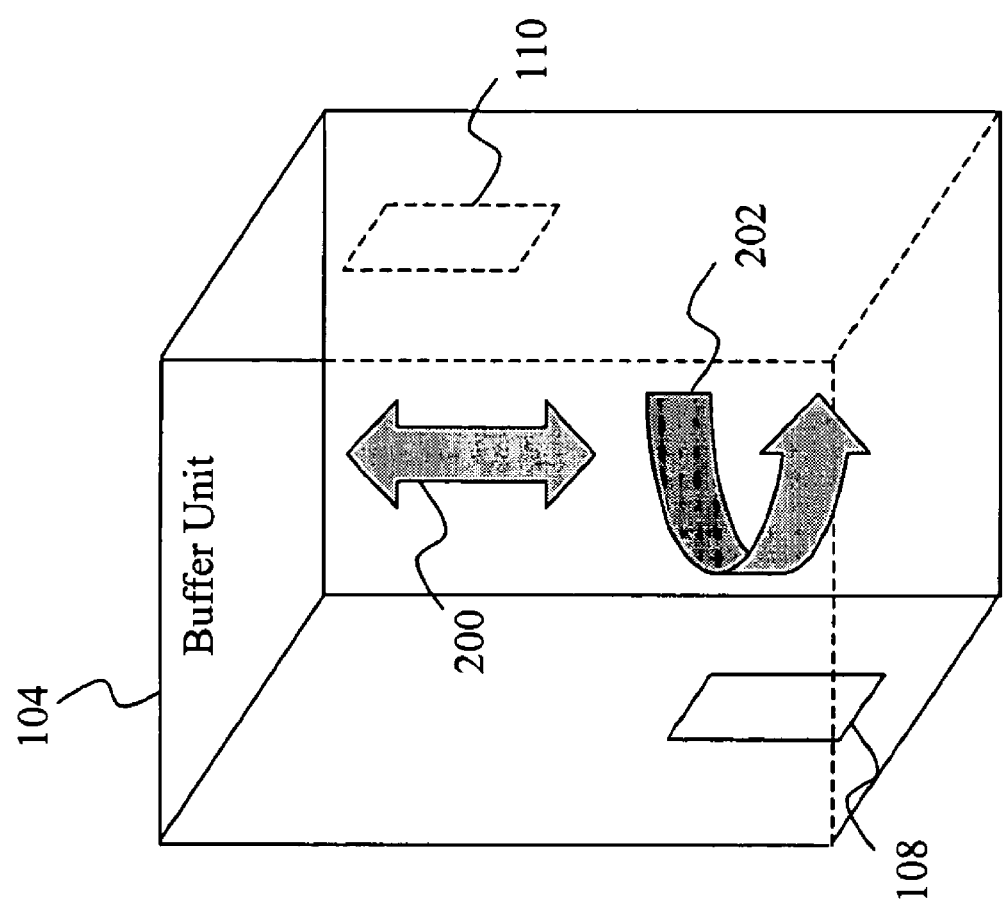
FIG. 2 is a diagram of one embodiment of a buffer unit of the system of FIG. 1.

With additional reference to FIG. 2, the buffer unit 104 may include a height adjusting member to adjust the height (denoted by reference numeral 200) of a substrate within the buffer unit, a rotating member to controllably rotate (denoted by reference numeral 202) a substrate within the buffer unit, and a standby area (not shown) to manipulate and/or hold the substrate during processing, as will be described below. The height adjusting member and rotating member may be used to receive the substrate 114 from the exposure unit 102 and reposition the substrate for transfer to the post-treatment unit 106. For example, as illustrated in FIGS. 1 and 2, the buffer unit 104 may receive the substrate from the exposure unit 102 via the output port 108 at a first height and transfer the substrate to the post treatment unit 110 at a second height. Rotation of the substrate may also be needed to properly position the substrate. The height and/or rotational adjustments of the substrate may be predetermined, or may be dynamically calculated using sensors that determine such factors as resist area or thickness. It is understood that such height and/or rotational adjustments may not be needed. The buffer system 104 may also include radiation shielding to protect the substrate/resist from exposure to light (e.g., power<650 lux), and may minimize or eliminate exposure of the substrate/resist to moisture (e.g., using a nitrogen containing ambient).

Referring again specifically to FIG. 1, the post treatment unit 106 includes a heating means (e.g., a thermal element such as a hot plate, an ultraviolet light source, a laser beam, or a rapid thermal anneal process). One example of such a post treatment unit is a hot plate system such as the APB5000 by Steag Hamatech AG of Germany. In the present example, the post treatment unit includes twenty-five independent temperature control zones that can be individually controlled, which enables the baking process to be tuned.

In some embodiments, multiple exposure units and/or post treatment units may be coupled to a single buffer unit. This may provide increased efficiency by allowing the number of exposure units and post treatment units to be selected with the purpose of delaying wait times. For example, if an exposure unit takes between eight and ten hours to perform an exposure process and a post treatment unit takes only about one-half hour to perform a baking process, then multiple exposure units may be coupled via a buffer unit to a single post treatment unit. Batches may then be timed and staggered so that the end of an exposure period approximately matches the availability of the post treatment unit, preventing undue delays between exposing and baking.

Figure 3B:
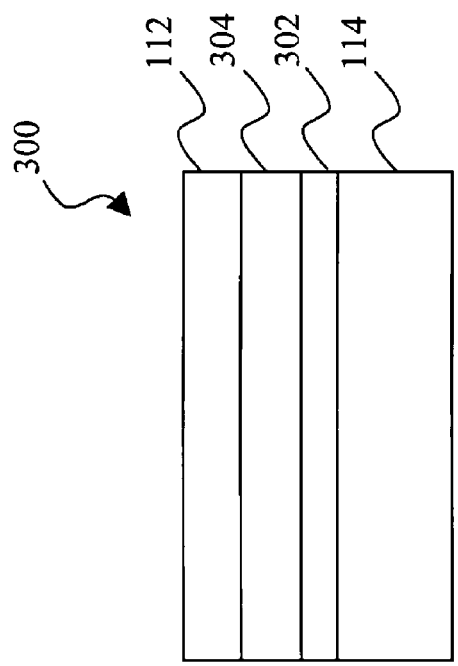
Figure 3A:
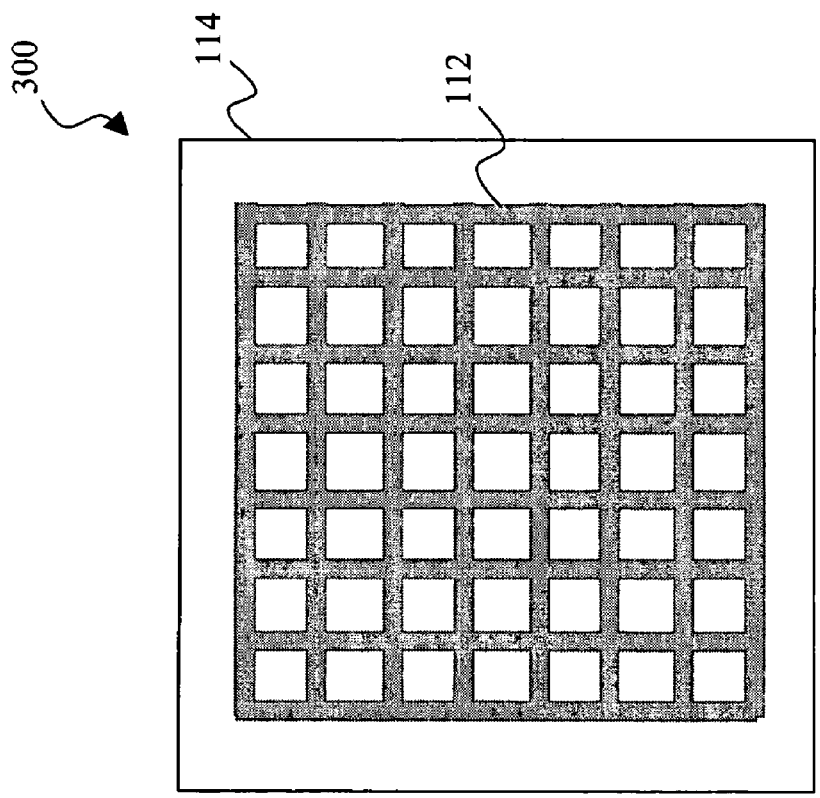
FIG. 3a illustrates one embodiment of a mask that may be made using the system of FIG. 1.

Referring to FIGS. 3a and 3b, in the present example, the substrate 114 is a quartz substrate that may be covered in a layer of chromium and/or chromium oxide. At least a portion of the layer of chromium/chromium oxide may be covered with a chemically amplified photoresist 112. For example, the substrate 114 may be a quartz mask blank that is coated with a film stack. The film stack may be a non-homogeneous layer of chromium oxide 304 on top of a thin layer of pure chromium 302. The chromium layer 302 provides an opaque and mechanically strong layer to prevent light penetration through the mask. The chromium oxide layer 304 is grown on the chromium layer to minimize the reflections off of the mask. This is then coated with the resist layer 112. It is understood that other materials may be used, such as $CaF_2$, Ti, Ta, ITO, and $CeO_2$.

Direct mask writing using an electron beam may result in a low throughput, which can be aided by the use of chemically amplified resists. As is known, a chemically amplified resist for an exposure method such as electron beam lithography may contain a polymer with dissolution-inhibiting groups, a photo-reactive compound, an electron-beam-sensitive sensitizer to enhance the exposure sensitivity of the resist, such as a fluorene derivative, and a solvent. It is understood that other chemically amplified resists may be used. Generally, the layer of chemically amplified resist is relatively thin and an even distribution of the resist layer may be important. However, such resists are often sensitive to moisture, radiation, and particle contamination, as well as to contamination by other chemicals that may be used during the mask making process, such as $NH_3$ or $NH_4^+$.

Referring again to FIG. 1, the system 100 may include one or more chemical filters that prevents the chemically amplified resist 112 from reacting with other chemicals that may be in the environment. In the present example, the output port 108 of the exposure unit 102 includes a filter 116, the buffer unit 104 includes a filter 118, and the post treatment unit 106 includes a filter 120. It is noted that the exposure unit 102 may not include a filter, as it is a vacuum chamber.

In addition, in conventional systems, particle and radiation contamination may occur when the substrate 114 is moved from an exposure unit to a baking unit. However, due at least in part to the fact that the exposure unit 102 is coupled to the post treatment unit 106 via the buffer unit 104 (and the wafer 114 is not exposed to the environment outside of the units when being moved from one unit to another), the risk of particle contamination is reduced. The enclosed processing system provided by the exposure unit 102, buffer unit 104, and post treatment unit 106 also aids in preventing radiation contamination of the resist 112.

Figure 4:
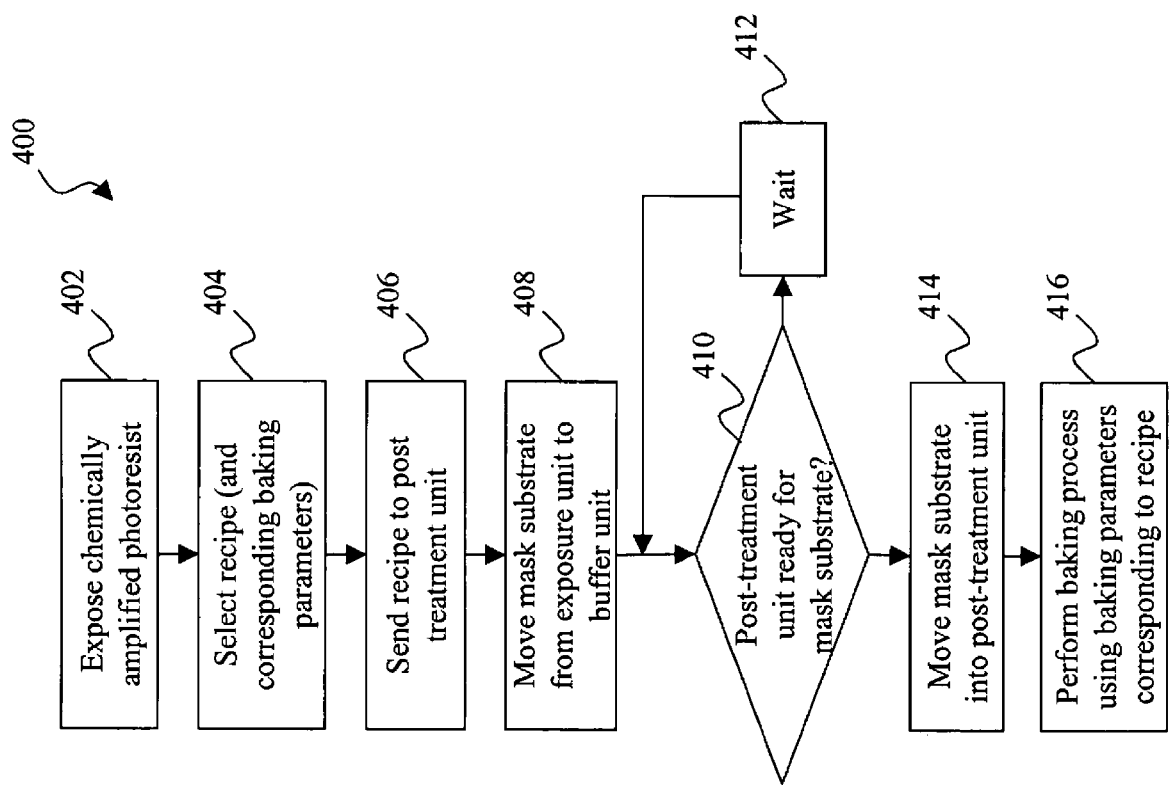
FIG. 4 is a flowchart of one embodiment of a method that may be implemented within the system of FIG. 1.

Referring now to FIG. 4 and with continued reference to FIG. 1, a method 400 illustrates one embodiment of a process that may be implemented within the system of FIG. 1. In the present example, the assumption is made that error locations on a mask are repeatable (if the direction of the masks throughout the process is maintained). Errors identified through a process such as after development identification (ADI) using engineer test plates may then be compensated for by tuning the independent temperature control zones of the post treatment unit 106.

Accordingly, the method 400 begins in step 402 by exposing the chemically amplified photoresist 112 on the substrate 114 using the exposure unit 102. In step 404, a recipe and corresponding baking parameters (e.g., duration and temperature) are selected by the exposure unit 102 for the post treatment unit 106. The baking parameters may be selected based on predefined recipes, may be dynamically selected based on one or more parameters of the substrate 114, resist 112, and/or exposure parameters, or may be selected in any other way. In the present example, the exposure unit 102 is coupled to the post treatment unit 106 by a connection (not shown) that provides 256 signals (e.g., an eight bit signaling path). Each of the 256 signals may be used to select a recipe. For example, each signal may refer to a separate baking recipe (that includes temperature, duration, etc.). A software program, such as a job manager, in the exposure unit 102 may then select one of the 256 numbers (0-255), and the corresponding baking temperature and time that have been defined in the post-treatment unit 106 for the selected number will be applied. For example, the number 0 may correspond to a temperature of 90 degrees and a duration of 300 seconds within the post treatment unit 106, so selecting the number 0 in the exposure unit 102 will apply those parameters within the post treatment unit. The number 1 may correspond to a temperature of 95 degrees and a duration of 600 seconds, and each number up to 255 may be defined similarly.

It is understood that the numbers may refer to a particular order of temperatures and durations, or may be otherwise assigned (e.g., a number may be assigned as new recipes are created). In some embodiments, a number may represent a single parameter. For example, the number 0 may represent a temperature of 95 degrees and the number 128 may define a duration of 300 seconds. In these embodiments, different recipes may be designated by sending the numbers corresponding to the desired parameters from the exposure unit 102 to the post treatment unit 106. In step 406, the selected recipe is sent to the post treatment unit 106.

In step 408, the substrate 114 is moved into the buffer unit 104 through the output port 108. The height adjusting member and the rotating member within the buffer unit 104 may be used to position the substrate 114 for placement into the post treatment unit 106. In step 410, a determination is made as to whether the post treatment unit 106 is ready for the substrate 114. For example, the post treatment unit 106 may be currently performing a baking process on another substrate or group of substrates, or may be undergoing a cleaning process to remove contamination. If the post treatment unit 106 is not ready, the substrate 114 may be moved into the standby area to wait (step 412) until the post treatment unit is ready. It is understood that the buffer unit 104 may be configured to receive or move the substrate 114 into the standby area initially (e.g., prior to step 410). In step 414, the substrate 114 is moved into the post-treatment unit 206. As stated previously, the removal of the substrate 114 from the exposure unit 102 may be timed to coincide approximately with the readiness of the post treatment unit 106 to minimize the delay in baking the substrate. In step 416, the post treatment unit 106 performs the baking process using the baking parameters associated with the recipe selected by the exposure unit 102 in step 404.

It is understood that the movement of the substrate 114 through the buffer unit 104 may occur in either direction (i.e., from the exposure unit to the post treatment unit or vice versa). Regardless of the direction of movement, the buffer unit 104 may provides advantages with respect to minimizing or preventing moisture, particle, and/or radiation contamination.

Figure 5:
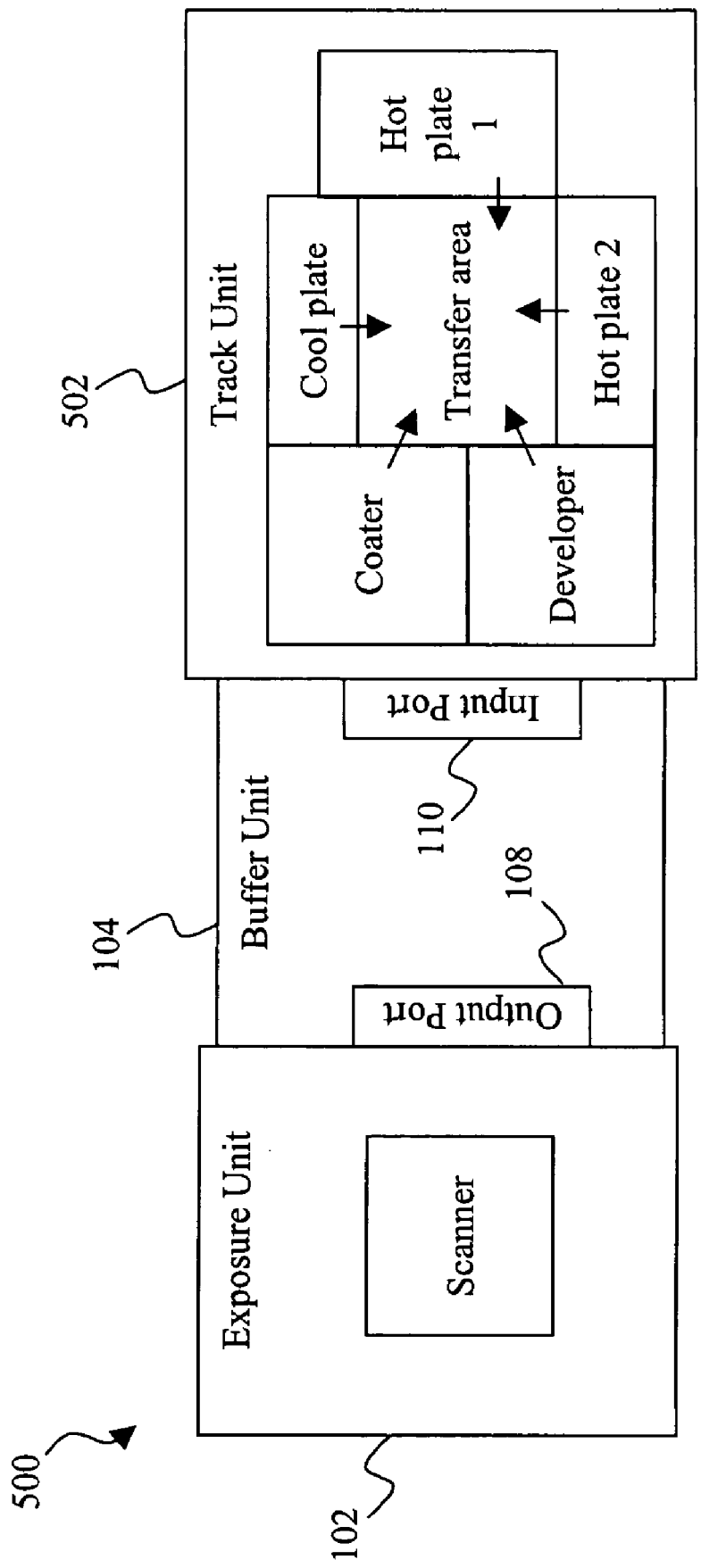
FIG. 5 is a schematic view of another embodiment of a system for implementing the present disclosure.

Referring now to FIG. 5, in another embodiment, a system 500 for manufacturing a mask is illustrated. The system includes an exposure unit 102 and a buffer unit 104, which are similar or identical to those described with respect to the system 100 of FIG. 1. The system 500 also includes a track unit 502. The track unit 502 includes a coater for applying resist, a developer for developing resist that has been exposed by the exposure unit 102, hot plates 1 and 2, a cool plate, and a transfer area for transferring a substrate among the coater, developer, hot plates, and cool plate.

An exemplary process flow using the system 500 may include the following steps: coating, soft baking, cooling, exposing, post exposure baking, cooling, developing, hard baking, and cooling. Accordingly, the substrate should be moved from the track unit 502 to the exposure unit 102 for exposing, and then back to the track unit 502 after exposing occurs. Typically, the parameters used in post exposure baking and the delay between exposure and post exposure baking play an important role in the uniformity of a mask's critical dimensions. In the present example, to aid in controlling the uniformity, parameters (e.g., temperature and duration) selected by the exposure unit 102 may be transferred to the track unit 502. It is understood that the parameters themselves may not be selected by the exposure unit 102, but a recipe (and the recipe's corresponding parameters) associated with the exposed mask may be selected. The parameters may be used, for example, to compensate for deviations from the uniformity of exposure caused by variations in electron beam energy dosage. The track unit 502 may use the parameters to compensate for the deviations by controlling the post exposure baking process.

The buffer unit 104 enables the substrate to be moved between the exposure unit 102 and track unit 502 while minimizing or preventing moisture, particle, and/or radiation contamination. In addition, the buffer unit 104 may control the delivery of the exposed substrate to the track unit 502 in order to minimize or eliminate post exposure baking delays. For example, the buffer unit 104 may be connected to multiple exposure units, and may move substrates between the various exposure units and the track unit in order to minimize the time each substrate should wait. The buffer unit 104 may also prioritize substrate from various exposure units in order to ensure that more time sensitive processes are handled prior to other processes having a lower priority.

It is understood that the preceding embodiments may be implemented using hardware and/or software. For example, executable software instructions may be stored on one or more memories coupled to the exposure unit 102, buffer unit 104, and/or post-treatment unit 106/track unit 502. The instructions may be executed by a processor within one or more of the exposure unit 102, buffer unit 104, and/or post-treatment unit 106/track unit 502, or the instructions may be processed elsewhere and sent to the applicable part of the systems 100 or 500.

The foregoing has outlined features of several embodiments so that those skilled in the art may better understand the detailed description. Those skilled in the art should understand that all spatial references herein are for the purpose of example only and are not meant to limit the disclosure. Those skilled in the art should also appreciate that they may readily use the present disclosure as a basis for designing or modifying other processes and structures for carrying out the same purposes and/or achieving the same advantages of the embodiments introduced herein. Those skilled in the art should further realize that such equivalent constructions do not depart from the spirit and scope of the present disclosure, and that they may make various changes, substitutions and alterations herein without departing from the spirit and scope of the present disclosure.

What is claimed is:

1. A system for manufacturing a mask for semiconductor processing using a chemically amplified photoresist on a substrate, the system comprising:

at least one exposure unit configured to select a recipe for a later baking process in a post treatment unit;

a buffer unit coupled to the exposure unit and configured to move the mask substrate from the exposure unit to the post treatment unit without exposing the mask substrate to the environment; and the post treatment unit coupled to the buffer unit and the exposure unit and configured to perform a baking process on the mask substrate using baking parameters associated with the recipe selected by the exposure unit, wherein the buffer unit includes a height adjusting member for adjusting a height of the substrate, a rotating member for rotating the substrate, and a standby area for holding the substrate if the post treatment unit is not ready to receive the substrate.

2. The system of claim 1 wherein the exposure unit is configured to send a signal to the post treatment unit, wherein the signal designates the recipe for use by the post treatment unit from a plurality of recipes stored on a memory coupled to the post treatment unit.

3. The system of claim 1 wherein the recipe includes a temperature and a duration of the baking process.

4. The system of claim 1 wherein the exposure unit includes a charged source for exposing the chemically amplified photoresist.

5. The system of claim 4 wherein the charged source is an electron beam.

6. The system of claim 4 wherein the charged source is an ion beam.

7. The system of claim 1 wherein the exposure unit includes a non-charged source for exposing the chemically amplified photoresist.

8. The system of claim 7 wherein the non-charged source is a laser beam.

9. The system of claim 1 wherein the post treatment unit includes a plurality of independent temperature control zones.

10. The system of claim 1 wherein the post treatment unit includes an ultraviolet light source.

11. The system of claim 1 wherein the post treatment unit includes a laser beam.

12. The system of claim 1 wherein the post treatment unit is configured to perform a rapid thermal anneal process.

13. The system of claim 1 wherein at least one of the buffer unit and the post treatment unit includes a chemical filter to prevent contamination of the mask substrate.

14. The system of claim 1 wherein the buffer unit includes radiation shielding means for preventing radiation contamination of the mask substrate.

15. The system of claim 1 wherein the buffer unit includes means for preventing moisture contamination of the mask substrate.

16. The system of claim 1 further comprising a plurality of exposure units, wherein each of the plurality of exposure units is coupled to the post treatment unit via the buffer unit.

* * * * *